(12) United States Patent
Chun et al.

(10) Patent No.: US 9,755,020 B2
(45) Date of Patent: Sep. 5, 2017

(54) SEMICONDUCTOR DEVICE AND MANUFACTURING METHOD THEREOF

(71) Applicant: HYUNDAI MOTOR COMPANY, Seoul (KR)

(72) Inventors: Dae Hwan Chun, Gwangmyeong-si (KR); Youngkyun Jung, Seoul (KR); Nack Yong Joo, Hanam-si (KR); Junghee Park, Suwon-si (KR); Jong Seok Lee, Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 0 days.

(21) Appl. No.: 15/342,363

(22) Filed: Nov. 3, 2016

(65) Prior Publication Data
US 2017/0170275 A1   Jun. 15, 2017

(30) Foreign Application Priority Data

Dec. 14, 2015   (KR) .................. 10-2015-0178095

(51) Int. Cl.
| | | |
|---|---|---|
| H01L 29/06 | (2006.01) | |
| H01L 29/08 | (2006.01) | |
| H01L 29/16 | (2006.01) | |
| H01L 29/78 | (2006.01) | |
| H01L 29/861 | (2006.01) | |

(52) U.S. Cl.
CPC ...... H01L 29/0847 (2013.01); H01L 29/0684 (2013.01); H01L 29/1608 (2013.01); H01L 29/78 (2013.01); *H01L 29/861* (2013.01)

(58) Field of Classification Search
CPC . H01L 29/0847; H01L 29/1608; H01L 29/78; H01L 29/0684; H01L 29/861
See application file for complete search history.

(56) References Cited

U.S. PATENT DOCUMENTS

| | | | | |
|---|---|---|---|---|
| 7,605,426 B2* | 10/2009 | Saito | .................. | H01L 29/0634 257/329 |
| 7,863,685 B2 | 1/2011 | Hshieh | | |
| 8,076,719 B2* | 12/2011 | Zeng | .................. | H01L 29/0634 257/330 |

FOREIGN PATENT DOCUMENTS

| | | |
|---|---|---|
| JP | 2007-281352 A | 10/2007 |
| JP | 2012-178536 A | 9/2012 |
| KR | 10-1236030 B1 | 2/2013 |
| KR | 10-2014-0044075 A | 4/2014 |
| KR | 10-1380113 B1 | 4/2014 |
| KR | 10-2014-0062868 A | 5/2014 |

* cited by examiner

*Primary Examiner* — David Vu
(74) *Attorney, Agent, or Firm* — McDermott Will & Emery LLP

(57) ABSTRACT

A semiconductor device includes a first n− type layer and a second n− type layer that are sequentially disposed on a first surface of an n+ type silicon carbide substrate; a first trench and a second trench that are disposed at the second n− type layer and are spaced apart from each other; a p type region surrounding a lateral surface and a lower surface of the first trench; an n+ type region disposed on the p type region and the second n− type layer; a gate insulating layer disposed in the second trench; a gate electrode disposed on the gate insulating layer; an oxide layer disposed on the gate electrode; a source electrode disposed on the oxide layer and the n+ type region disposed in the first trench; and a drain electrode disposed at a second surface of the n+ type silicon carbide substrate.

11 Claims, 9 Drawing Sheets

SEMICONDUCTOR DEVICE AND MANUFACTURING METHOD THEREOF

CROSS-REFERENCE TO RELATED APPLICATION

This application claims the benefit of priority to Korean Patent Application No. 10-2015-0178095 filed in the Korean intellectual Property Office on Dec. 14, 2015, the entire content of which is incorporated herein by reference.

TECHNICAL FIELD

The present disclosure relates to a semiconductor device including a silicon carbide (SiC) and a manufacturing method thereof.

BACKGROUND

A power semiconductor device generally requires low turn-on resistance or a low saturated voltage in order to reduce power loss in a conductive state while a large amount of current flows. Further, the power semiconductor device requires a characteristic of enduring an inverse directional high voltage at a PN conjunction thereof, which may be applied to opposite terminals of the power semiconductor device when it is turned off or when a switch is turned off, that is, to have a high breakdown voltage characteristic.

When various power semiconductor devices basically satisfying electrical and physical conditions are packaged in one module, the number of semiconductor devices included in the packaged module and electrical specifications thereof may vary depending on conditions required by a system.

Generally, a three-phase power semiconductor module is used so as to generate a Lorentz force for driving a motor. That is, the three-phase power semiconductor module controls a current and power applied to the motor, such that a driven state of the motor is determined.

Although conventional silicon insulated gate bipolar transistors (IGBTs) and silicon diodes have been included and used in such a three-phase semiconductor module, the three-phase semiconductor module has recently tended to includes silicon carbide (SiC) metal oxide semiconductor field effect transistors (MOSFETs) and silicon carbide diodes in order to minimize power consumption therein and to increase a switching speed thereof.

When the silicon IGBTs or silicon carbide MOSFETs are connected to separate diodes, a plurality of wires are required for the connection. Since parasitic capacitance and inductance occur due to the plurality of wires, the switching speed of the module may be reduced.

The above information disclosed in this Background section is only to enhance the understanding of the background of the invention, and therefore, it may contain information that does not form the prior art that is already known in this country to a person of ordinary skill in the art.

SUMMARY

The present disclosure has been made in an effort to provide a silicon carbide semiconductor device that performs a MOSFET operation and a diode operation.

According to an exemplary embodiment in the present disclosure, a semiconductor device includes a first n− type layer and a second n− type layer that are sequentially disposed on a first surface of an n+ type silicon carbide substrate; a first trench and a second trench that are disposed at the second n− type layer and are spaced apart from each other; a p type region that surrounds a lateral surface and a lower surface of the first trench; an n+ type region that is disposed on the p type region and the second n− type layer; a gate insulating layer disposed in the second trench; a gate electrode disposed on the gate insulating layer; an oxide layer disposed on the gate electrode; a source electrode that is disposed on the oxide layer and the n+ type region and that is disposed in the first trench; and a drain electrode that is disposed at a second surface of the n+ type silicon carbide substrate.

A doping concentration of the second n− type layer may be different from that of the first n− type layer.

The second n− type layer may be disposed between the second trench and the p type region.

The semiconductor device may further include a p+ type region disposed between the p type region and the lower surface of the first trench.

The source electrode may contact the p+ type region disposed under the first trench.

The source electrode and the drain electrode may include an ohmic metal.

A doping concentration of the second n− type layer may be equal to that of the first n− type layer.

According to another embodiment in the present disclosure, a manufacturing method of a semiconductor device includes sequentially forming a first n− type layer and a second n− type layer on a first surface of an n+ type silicon carbide substrate; forming an n+ type region on the second n− type layer; forming a first trench and a second trench spaced apart from each other by etching the n+ type region and the second n− type layer; forming a p type region to surround a lateral portion and a lower portion of the first trench; forming a p+ type region between the lower surface of the first trench and the p type region; forming a gate insulating layer in the second trench; forming a gate electrode on the gate insulating layer; forming an oxide layer on the gate electrode; forming a source electrode on the oxide layer and the n+ type region, and in the first trench; and forming a drain electrode at a second surface of the n+ type silicon carbide substrate, wherein the source electrode may contact the p+ type region disposed under the first trench.

In the forming of the p type region, p ions may be injected by a tilt ion injecting method.

According to the embodiment in the present disclosure, since the semiconductor device may perform a MOSFET operation and a diode operation, the semiconductor device does not need to have a wire for connecting a MOSFET device and a diode device. Accordingly, a size of the semiconductor device may be reduced.

Further, according to the embodiment in the present disclosure, since one semiconductor device may perform the MOSFET operation and the diode operation without the wire, a switching speed of the semiconductor device may be improved.

DETAILED DESCRIPTION OF THE EMBODIMENTS

Figure 1:
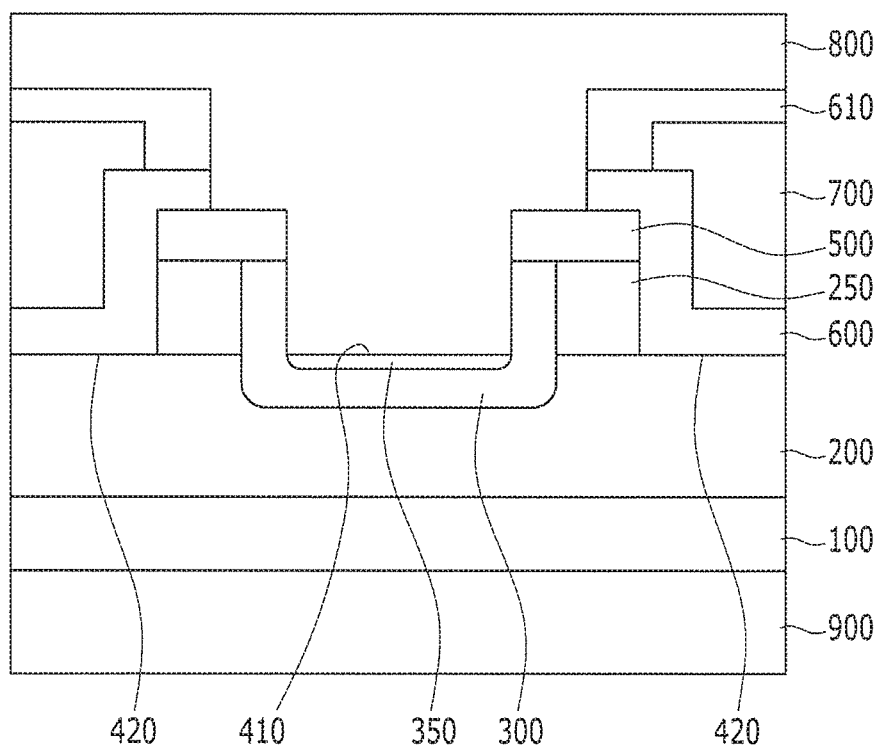
FIG. 1 illustrates a schematic cross-sectional view of a semiconductor device according to an exemplary embodiment in the present disclosure.

The present disclosure will be described more fully hereinafter with reference to the accompanying drawings, in which exemplary embodiments of the disclosure are shown. However, it is to be understood that the disclosure is not limited to the disclosed embodiments, but on the contrary, is intended to cover various modifications. As those skilled in the art would realize, the described embodiments may be modified in various different ways, all without departing from the spirit or scope of the present disclosure.

In the drawings: the thickness of layers, films, panels, regions, etc., are exaggerated for clarity. It will be understood that when an element such as a layer, film, region, or substrate is referred to as being "on" another element, it can be directly on the other element or intervening elements may also be present.

FIG. 1 illustrates a schematic cross-sectional view of a semiconductor device according to an exemplary embodiment in the present disclosure.

Referring to FIG. 1, a semiconductor device according to the present disclosure includes an n+ type silicon carbide substrate 100, a first n− type layer 200, a second n− type layer 250, a p type region 300, a p+ type region 350, an n+ type region 500, a gate electrode 700, a source electrode 800, and a drain electrode 900.

The first n− type layer 200 and the second n− type layer 250 are sequentially disposed on a first surface of the n+ type silicon carbide substrate 100. A doping concentration of the second n− type layer 250 is different from a doping concentration of the first n− type layer 200. That is, the doping concentration of the second n− type layer 250 may be less than or greater than w that of the first n− type layer 200. However, the present disclosure is not limited thereto, and the doping concentration of the second n− type layer 250 may be equal to the doping concentration of the first n− type layer 200.

A first trench 410 and a second trench 420, which are spaced apart from each other, are disposed at the second n− type layer 250. Accordingly, the second n− type layer 250 is disposed between the first trench 410 and the second trench 420.

The p type region 300 is disposed at a lateral portion and a lower portion of the first trench 410, and surrounds the lateral portion and the lower portion of the first trench 410. The p+ type region 350 is disposed between the p type region 300 and the lower portion of the first trench 410.

The n+ type region 500 is disposed on the p type region 300 and the second n− type layer 250.

A gate insulating layer 600 is disposed in the second trench 420. The gate electrode 700 is disposed on the gate insulating layer 600. An oxide layer 610 is disposed on the gate electrode 700. The oxide layer 610 covers a lateral surface of the gate electrode 700.

The source electrode 800 is disposed on the n+ type region 500 and the oxide layer 610, and in the first trench 410. The source electrode 800 contacts the p+ type region 350 at the lower surface of the first trench 410, and the p type region 300 at the lateral surface of the first trench 410. The drain electrode 900 is disposed at a second surface of the n+ type silicon carbide substrate 100. Here, the source electrode 800 and the drain electrode 900 may include an ohmic metal, respectively. The second surface of the n+ type silicon carbide substrate 100 is an opposite surface of the first surface of the n+ type silicon carbide substrate 100.

The semiconductor device according to the present disclosure performs a metal oxide semiconductor field effect transistor (MOSFET) operation and a diode operation. In this case, the MOSFET operation and the diode operation are separately performed according to an applied voltage.

An operation of the semiconductor device will now be described with reference to FIG. 2 to FIG. 4.

Figure 2:
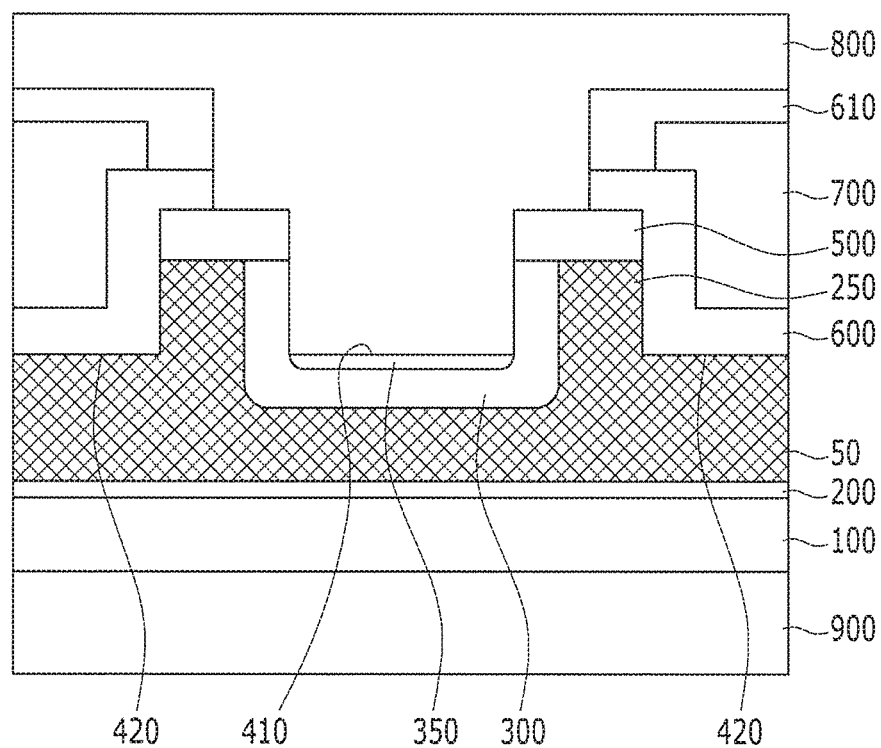
FIGS. 2 to 4 respectively illustrate a schematic diagram of an operation of the semiconductor device of FIG. 1.
Figure 3:
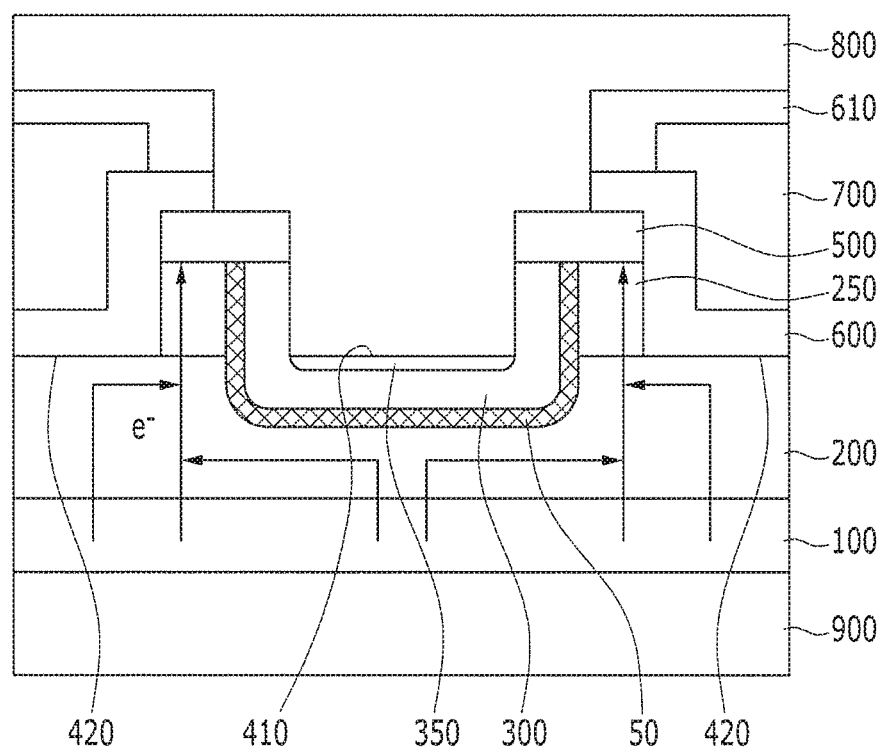
Figure 4:
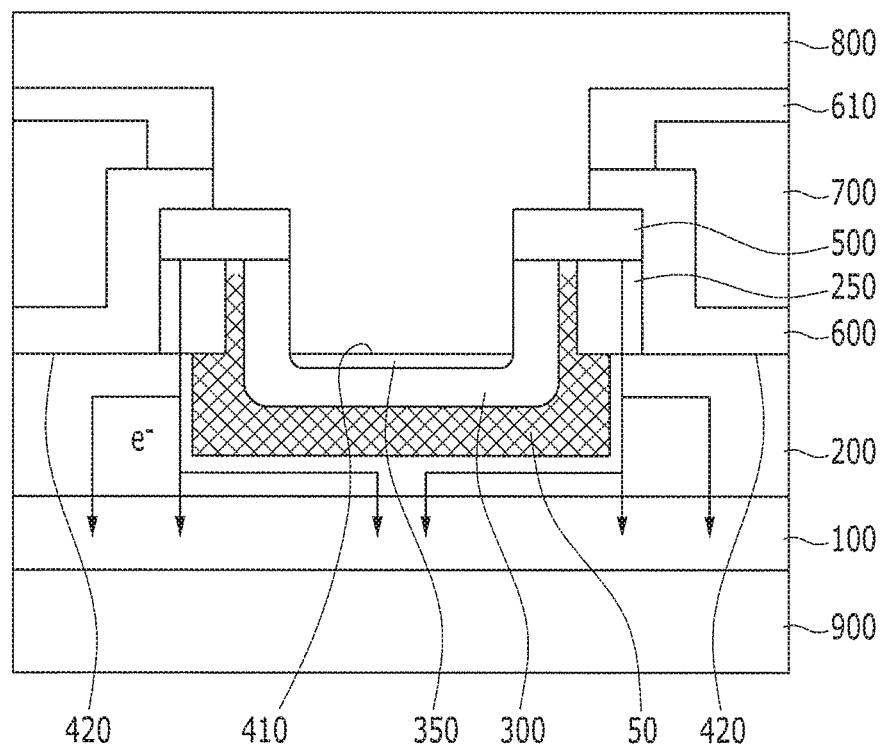

FIGS. 2 to 4 respectively illustrate a schematic diagram of an operation of the semiconductor device of FIG. 1.

FIG. 2 illustrates an off-state in which the semiconductor device of FIG. 1 is turned off. FIG. 3 illustrates a diode operation state of the semiconductor device of FIG. 1. FIG. 4 illustrates a MOSFET operation state according to FIG. 1.

The semiconductor device is turned off under the following conditions.

$V_{GS}<V_{TH}, V_{DS}\geq 0$ V

The diode operation of the semiconductor device is performed under the following conditions.

$V_{GS}<V_{TH}, V_{DS}<0$ V

The MOSFET operation of the semiconductor device is performed under the following conditions.

$V_{GS}\geq V_{TH}, V_{DS}>0$ V

Herein, $V_{TH}$ is a threshold voltage of the MOSFET, $V_{GS}$ is $(V_G-V_S)$, and $V_{DS}$ is $(V_D-V_S)$. $V_G$ is a voltage applied to the gate electrode, $V_D$ is a voltage applied to the drain electrode, and $V_S$ is a voltage applied to the source electrode.

Referring to FIG. 2, when the semiconductor device is turned off, a depletion layer 50 is formed to wholly cover the second n− type layer 250 and to almost cover the first n− type layer 200, such that a current flow does not occur. Referring to FIG. 3, when the semiconductor device performs the diode operation, electrons (e−) move from the drain electrode 900 to the source electrode 800. The electrons (e−) outputted from the drain electrode 900 move to the source electrode 800 through the first n− type layer 200 and the second n− type layer 250. In this case, the depletion layer 50 is formed at the first n− type layer 200 and the second n− type layer 250 of the lateral portion and the lower portion of the p type region 300.

Referring to FIG. 4, when the semiconductor device performs the MOSFET operation, the electrons (e−) move from the source electrode 800 to the drain electrode 900. The electrons (e−) outputted from the source electrode 800 move to the drain electrode 900 through the second n− type layer 250 and the first n− type layer 200. In this case, the depletion layer 50 is formed at the first n− type layer 200 and the second n− type layer 250 of the lateral portion and the lower portion of the p type region 300. Here, the doping concentration of the second n− type layer 250 may be greater than that of the first n− type layer 200. An area of the depletion layer 50 formed at the lower portion of the p type region 300 is greater than that of the depletion layer 50 formed at the lateral portion of the p type region 300.

As such, since the semiconductor device according to the present disclosure performs the MOSFET operation and the diode operation, a wire for connecting a typical MOSFET device and a diode device is not needed. Accordingly, a size of the semiconductor device may be reduced.

Further, since one semiconductor device may perform the MOSFET operation and the diode operation without the wire, a switching speed of the semiconductor device may be improved.

Hereinafter, characteristics of the semiconductor device according to the present disclosure, a typical diode device, and a typical MOSFET device will be compared and described with reference to Table 1.

Table 1 represents respective simulation results for the semiconductor device according to the present disclosure, the typical diode device, and the typical MOSFET device.

Comparative Example 1 is the typical diode device, and Comparative Example 2 is the typical MOSFET device. Comparative Example 3 is one in which the semiconductor device performs the MOSFET operation and the diode operation, wherein the gate electrode is a planar gate electrode that is not disposed at the trench but at a side of the source electrode.

In Table 1, current densities of respective semiconductor devices of Comparative Example 1. Comparative Example 2, and Comparative Example 3 are compared in a state in which substantially the same breakdown voltage is applied to the respective semiconductor devices.

TABLE 1

| | | Breakdown voltage (V) | Current density (A/cm$^2$) | Electrical conductive area (cm$^2$) @ 100 A |
|---|---|---|---|---|
| Comparative Example 1 | | 1541 | 305 | 0.33 |
| Comparative Example 2 | | 1538 | 502 | 0.20 |
| Comparative Example 3 | Diode operation | 1544 | 199 | 0.50 |
| | MOSFET operation | | 770 | |
| Exemplary Embodiment | Diode operation | 1556 | 222 | 0.45 |
| | MOSFET operation | | 1086 | |

Referring to Table 1, with respect to a current amount of about 100 A, an electrical conductive area of the diode device according to Comparative Example 1 is about 0.33 cm$^2$, and an electrical conductive area of the MOSFET device according to Comparative Example 2 is about 0.20 cm$^2$. A sum of the electrical conductive areas according to Comparative Example 1 and Comparative Example 2 is about 0.53 cm$^2$ when the current amount of the semiconductor devices is about 100 A.

When the diode operation is performed with respect to the current amount of about 100 A, an electrical conductive area of the semiconductor device according to Comparative Example 3 is about 0.50 cm$^2$. In the case of the semiconductor device according to Comparative Example 3, when an area of the semiconductor device is about 0.50 cm', it can be seen that a current amount thereof is about 100 A during the diode operation and the current amount thereof is about 385 A during the MOSFET operation.

According to the exemplary embodiment, an electrical conductive area with respect to the current amount of about 100 A is about 0.45 cm$^2$ during the diode operation. When an area of the semiconductor device is about 0.45 cm$^2$, it can be seen that a current amount thereof is about 100 A during the diode operation and the current amount thereof is about 488.7 A during the MOSFET operation.

That is, in the electrical conductive areas with respect to the current amount of about 100 A, it can be seen that the corresponding area of the semiconductor device according to the exemplary embodiment is reduced by about 15% with respect to the sum of the corresponding areas of the semiconductor devices according to Comparative Examples 1 and 2. In addition, it can be seen that the corresponding area of the semiconductor device according to the exemplary embodiment is reduced by about 10% with respect to the corresponding area of the semiconductor device according to Comparative Example 3, Hereinafter, a manufacturing method of the semiconductor device illustrated in FIG. 1 will be described with reference to FIG. 5 to FIG. 9 and FIG. 1.

FIGS. 5 to 9 respectively illustrate a schematic cross-sectional view of a manufacturing method of the semiconductor device of FIG. 1.

Figure 5:
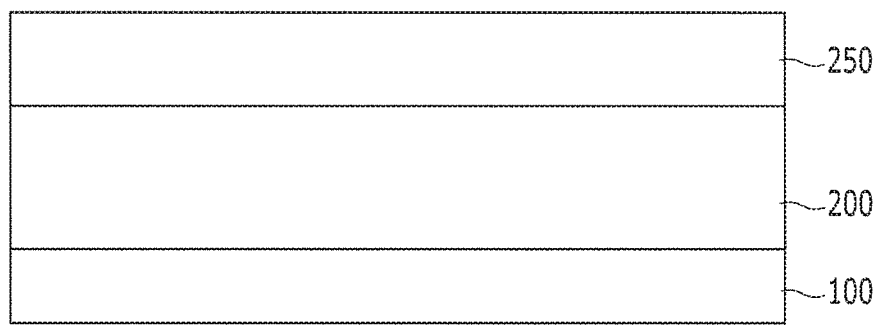
FIGS. 5 to 9 respectively illustrate a schematic cross-sectional view of a manufacturing method of the semiconductor device of FIG. 1.

Referring to FIG. 5, the n+ type silicon carbide substrate 100 is prepared, the first n− type layer 200 is formed at the first surface of the n+ type silicon carbide substrate 100 by an epitaxial growth, and then the second n− type layer 250 is formed on the first n− type layer 200 by epitaxial growth. The doping concentration of the second n− type layer 250 is different from that of the first n− type layer 200. That is, the doping concentration of the second n− type layer 250 may be less than or greater than that of the first n− type layer 200. However, the present disclosure is not limited thereto, and the doping concentration of the second n− type layer 250 may be equal to the doping concentration of the first n− type layer 200.

Figure 6:
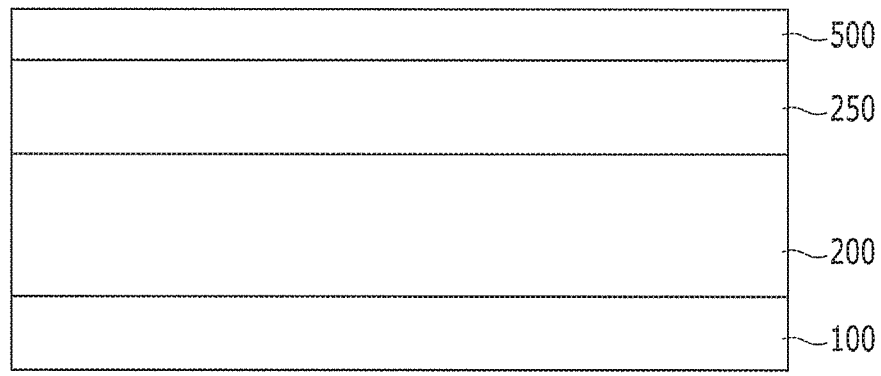

Referring to FIG. 6, the n+ type region 500 is formed on the second n− type layer 250. The n+ type region 500 may be formed by injecting n+ ions onto the second n− type layer 250, or may be formed on the second n− type layer 250 by epitaxial growth.

Figure 7:
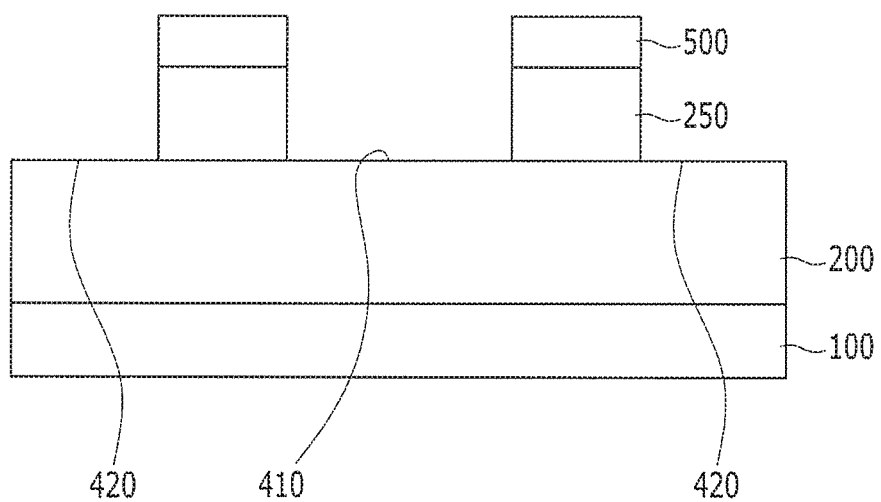

Referring to FIG. 7, the first trench 410 and the second trench 420 are formed by etching the n+ type region 500 and the second n− type layer 250. In this case, the first trench 410 and the second trench 420 are simultaneously formed.

Figure 8:
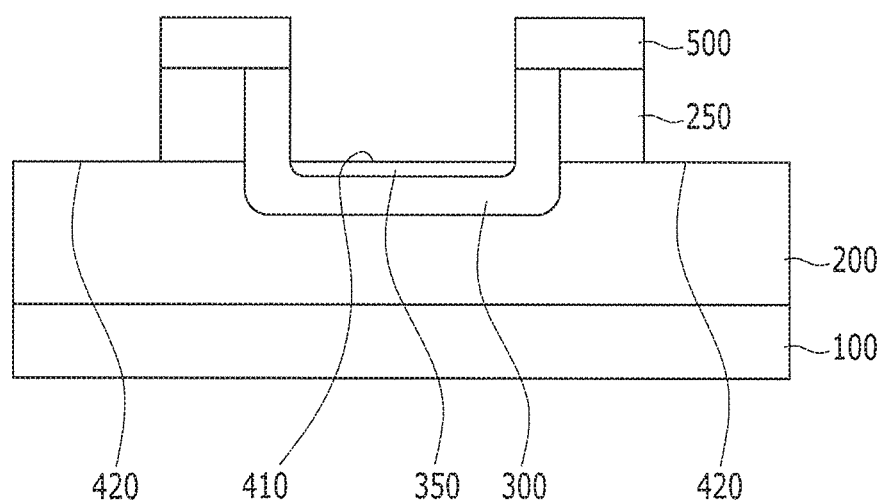

Referring to FIG. 8, the p type region 300 is formed by injecting p ions into the lateral surface and the lower surface of the first trench 410, and then the p+ type region 350 is formed by injecting p+ ions into the lower surface of the first trench 410. In this case, the p type region 300 is formed to surround the lateral surface and the lower surface of the first trench 410. In addition, the p+ type region 350 is formed between the p type region 300 and the lower portion of the first trench 410. In this case, the p ions are injected by a tilt ion injecting method. The tilt ion injecting method is one having a smaller injecting angle than a right angle with respect to a horizontal surface.

Figure 9:
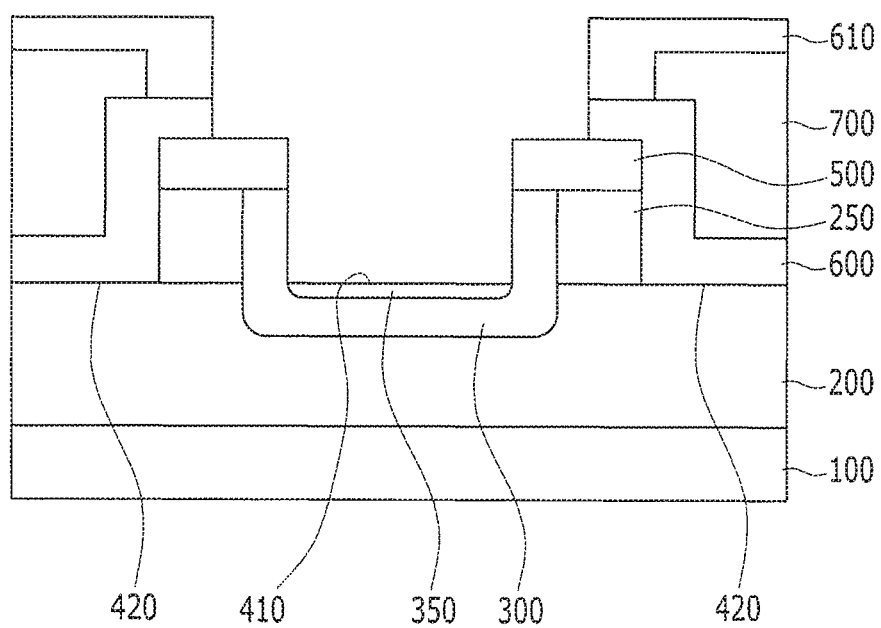

Referring to FIG. 9, after the gate insulating layer 600 is formed at the second trench 420, the gate electrode 700 is formed on the gate insulating layer 600, and then the oxide layer is formed on the gate electrode 700.

Referring to FIG. 1, the source electrode 800 is formed on the oxide layer 610 and the n+ type region 500, and at the first trench 410, and the drain electrode 900 is formed at the second surface of the n+ type silicon carbide substrate 100.

In the manufacturing method of the semiconductor device according to the present disclosure, after the first trench 410 and the second trench 420 are simultaneously formed, the p type region 300 and the p+ type region 350 may be formed. In a certain embodiment, after the first trench 410 is first formed, the p type region 300 and the p+ type region 350 may be formed and then the second trench 420 may be formed.

While this invention has been described in connection with what is presently considered to be practical exemplary embodiments, it is to be understood that the invention is not limited to the disclosed embodiments, but on the contrary, is intended to cover various modifications and equivalent arrangements included within the spirit and scope of the appended claims.

What is claimed is:

1. A semiconductor device comprising:
   a first n− type layer and a second n− type layer that are sequentially disposed on a first surface of an n+ type silicon carbide substrate;
   a first trench and a second trench that are disposed at the second n− type layer and are spaced apart from each other;
   a p type region that surrounds a lateral surface and a lower surface of the first trench;
   an n+ type region that is disposed on the p type region and the second n− type layer;
   a gate insulating layer disposed in the second trench;
   a gate electrode disposed on the gate insulating layer;
   an oxide layer disposed on the gate electrode;
   a source electrode that is disposed on the oxide layer and the n+ type region and that is disposed in the first trench; and
   a drain electrode that is disposed at a second surface of the n+ type silicon carbide substrate.

2. The semiconductor device of claim 1, wherein
   a doping concentration of the second n− type layer is different from that of the first n− type layer.

3. The semiconductor device of claim 2, wherein
   the second n− type layer is disposed between the second trench and the p type region.

4. The semiconductor device of claim 3, further comprising:
   a p+ type region disposed between the p type region and the lower surface of the first trench.

5. The semiconductor device of claim 4, wherein
   the source electrode contacts the p+ type region disposed under the first trench.

6. The semiconductor device of claim 1, wherein
   each of the source electrode and the drain electrode includes an ohmic metal.

7. The semiconductor device of claim 1, wherein
   a doping concentration of the second n− type layer is equal to that of the first n− type layer.

8. A manufacturing method of a semiconductor device, the manufacturing method comprising:
   sequentially forming a first n− type layer and a second n− type layer on a first surface of an n+ type silicon carbide substrate;
   forming an n+ type region on the second n− type layer;
   forming a first trench and a second trench spaced apart from each other by etching the n+ type region and the second n− type layer;
   forming a p type region to surround a lateral portion and a lower portion of the first trench;
   forming a p+ type region between the lower surface of the first trench and the p type region;
   forming a gate insulating layer in the second trench;
   forming a gate electrode on the gate insulating layer;
   forming an oxide layer on the gate electrode;
   forming a source electrode on the oxide layer and the n+ type region, and in the first trench; and
   forming a drain electrode at a second surface of the n+ type silicon carbide substrate,
   wherein the source electrode contacts the p+ type region disposed under the first trench.

9. The manufacturing method of claim 8, wherein
   a doping concentration of the second n− type layer is different from that of the first n− type layer.

10. The manufacturing method of claim 9, wherein in the forming of the p type region,
    p ions are injected by tilt ion injection.

11. The manufacturing method of claim 8, wherein
    a doping concentration of the second n− type layer is equal to that of the first n− type layer.

* * * * *